United States Patent [19]

Shaw et al.

[11] 4,214,232
[45] Jul. 22, 1980

[54] SERIAL-PARALLEL ANALOG-TO-DIGITAL CONVERTER USING VOLTAGE SUBTRACTION

[75] Inventors: Pern Shaw; Fuad H. Musa, both of Austin, Tex.; Stephen J. Kreinick, San Diego, Calif.

[73] Assignee: Motorola, Inc., Schaumburg, Ill.

[21] Appl. No.: 807,471

[22] Filed: Jun. 17, 1977

[51] Int. Cl.$^2$ .......................................... H03K 13/175
[52] U.S. Cl. ......................... 340/347 AD; 340/347 M
[58] Field of Search ................... 340/347 M, 347 AD; 324/99 D; 330/288; 307/304, 360

[56] References Cited

U.S. PATENT DOCUMENTS

| | | | |
|---|---|---|---|
| 3,860,952 | 1/1975 | Tallent et al. | 358/8 |
| 4,064,506 | 12/1977 | Cartwright | 330/288 X |

OTHER PUBLICATIONS

Nordstrom, High-Speed Integrated A/D Converter, 1976, IEEE International Solid-State Circuits Conference, p. 150.

The Engineering Staff of Analog Devices, Inc., Analog-Digital Conversion Handbook, 1972, pp. III-9 and III-10.

*Primary Examiner*—Thomas J. Sloyan
*Attorney, Agent, or Firm*—Walter W. Nielsen

[57] ABSTRACT

An analog-to-digital converter includes a first comparator which receives an analog input. The first comparator generates a plurality of reference voltages which establish a first continuous range of voltage gaps. The first comparator has a plurality of quantizing outputs, one of which will be at a logical one and the rest of which will be at logical zeros in order to indicate which of the voltage gaps encompasses the analog input voltage. The first comparator also has a reference current output whose magnitude is representative of which voltage gap encompasses the analog input voltage. A first encoder receives the quantizing outputs of the first comparator and generates a binary number which represents which of the voltage gaps the analog input voltage is encompassed by and which constitutes the most significant bit group of the binary digital representation of the analog input voltage. A voltage subtractor circuit receives as inputs the reference current output of the first comparator and the analog input. The voltage subtractor produces an output voltage which represents the voltage difference between a first boundary of the voltage gap which encompasses the analog input voltage and the value of the analog input voltage. The voltage subtractor output voltage is produced concurrently with the action of the first encoder, thereby providing overlapping operations for increased conversion speeds. This voltage is provided as an input to a second comparator which compares the output voltage produced by the voltage subtractor with a plurality of internal reference voltages which form a second continuous range of voltage gaps. The second comparator has a plurality of outputs, one corresponding to each of the voltage gaps encompassed by the reference voltages in the second comparator. The second comparator produces a logical one on an output corresponding to the particular voltage gap which encompasses the difference voltage produced by the voltage subtractor. A second encoder receives as inputs the outputs of the second comparator and generates a binary output which represents the difference voltage produced by the voltage subtractor and which constitutes the least significant bit group of the analog input voltage. In combination, the output of the first encoder and the output of the second encoder form a binary digital representation of the analog input voltage, including the most significant bits and the least significant bits thereof.

13 Claims, 12 Drawing Figures

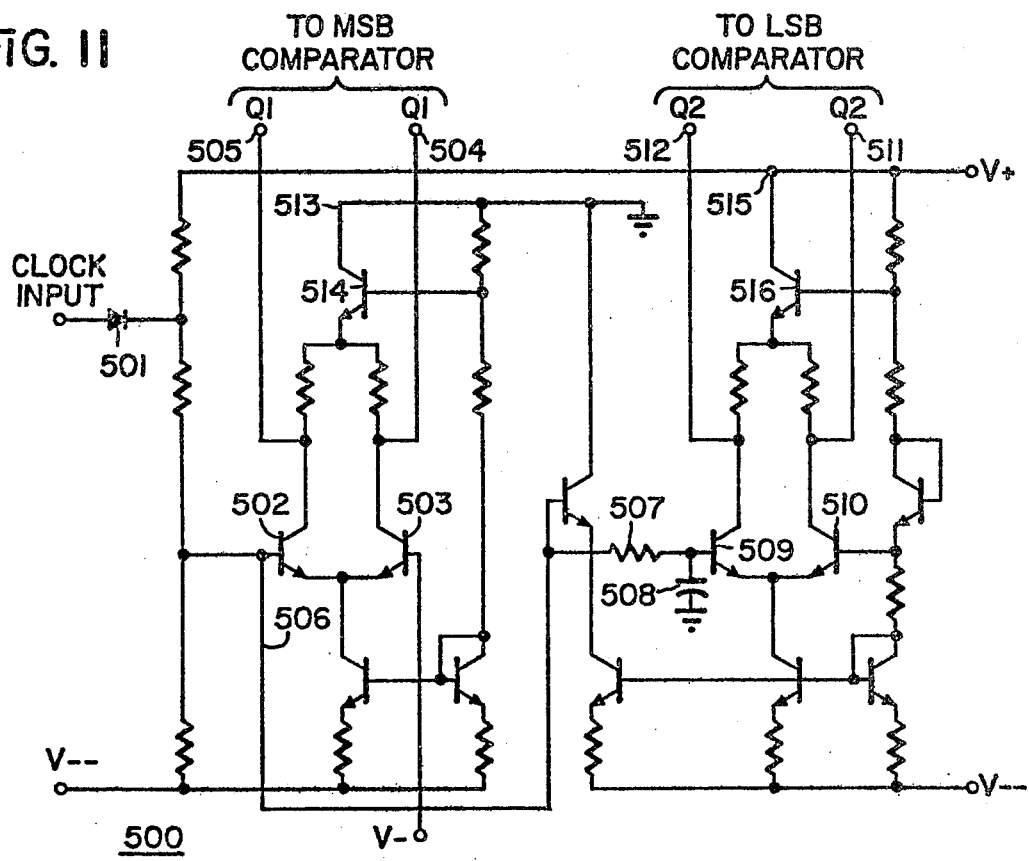

SERIAL-PARALLEL ANALOG-TO-DIGITAL CONVERTER USING VOLTAGE SUBTRACTION

RELATED APPLICATIONS

This application is related to the following patent applications of the assignee of the present invention:

Ser. No. 764,499 of Kreinick et al entitled Analog-To-Digital Converter, now abandoned.

2. Ser. No. 764,491 of Kreinick et al entitled Voltage Subtractor For Serial-Parallel Analog-To-Digital Converter, now U.S. Pat. No. 4,124,824.

3. Ser. No. 807,470 of Shaw et al entitled Serial-Parallel Analog-To-Digital Converter Using Reference Voltage Level Shifting.

4. Ser. No. 807,472 of Shaw et al entitled Reference Voltage Level Shifting Circuit For Serial-Parallel Analog-To-Digital Converter.

BACKGROUND OF THE INVENTION

The present invention relates to analog-to-digital conversion and, in particular, to a serial-parallel analog-to-digital converter with overlapping operations.

An analog-to-digital (A/D) converter encodes a voltage or current signal into a digital representation with respect to a known reference. Its accuracy is determined by the number of significant digits of the digital representation (typically the number of bits in a binary representation). The bandwidth of an A/D converter is determined by its conversion speed—the amount of time required to convert an applied input quantity to an equivalent digital representation. A widely applied class of A/D converters function by comparing an applied analog input signal to a known reference to produce a discrete or quantized signal and then encoding the quantized signal to produce a digital representation of the analog input. The particular A/D converters within this class range form what are called "serial" A/D converters in contrast to what are called "parallel" A/D converters. Serial A/D converters encode the applied analog input signal one bit at a time starting with the most significant bit and progressing sequentially towards the least significant bit. This is accomplished by coupling the analog input signal to the input of a single comparator and using control logic to couple different reference values to another input of the comparator for the conversion of each successive bit of the output representation. Thus, serial A/D converters are characterized by the advantages of relatively simple circuit configurations and low power consumption and by the disadvantage of slow conversion speeds. Parallel A/D converters, on the other hand, use a plurality of comparators each with its own distinct input reference value to allow all bits of the digital output representation to be produced simultaneously. Although the approach offers the advantage of minimum conversion time, this high speed operation is obtained only with greatly increased circuit complexity and component count. Thus, for binary output representations, N output bits would require $2^N$ separate comparators. Many potential applications for high speed A/D converters require digital output representation of 8-bits. In applications where an A/D converter interfaces with a bus-oriented microprocessor system, an 8-bit output (which can then correspond to a computer data byte) is particularly useful. Similarly, the encoding of samples representative of a 6 megahertz color video signal requires a converter of at least 8-bits and conversion times of 80 nanoseconds or less. The implementation of an A/D converter having an 8-bit output using the parallel approach would require 256 separate comparator circuits. An A/D converter of this complexity and high component count is impractical from a cost point of view and, in particular, precludes implementation in monolithic integrated circuit form.

Another approach to A/D conversion is the serial-parallel A/D converter which is a merger of the two conversion techniques previously discussed. In converters of this type, the digital output representation is partitioned into a most significant bit (MSB) group and a least significant bit (LSB) group. Parallel conversion is used to obtain the digital output representations of both the MSB group and the LSB group but these conversions are performed in a serial fashion with the initial representation of the MSB group determining the reference voltage value required for the parallel conversion of the LSB group. Serial-parallel A/D converters yield faster conversion speeds than the all serial A/D converters with a circuit configuration which is simpler and has lower power consumption than the all parallel A/D converter.

Prior art serial-parallel A/D converters perform a conversion in the following sequence:

1. Parallel A/D conversion is used to obtain a digital representation of the MSB group;

2. Digital-to-analog conversion is used to convert the MSB representation back to a analog signal;

3. The analog representation of the MSB group is either subtracted from the input analog signal or is used to generate a change in voltage reference such that an analog difference signal is produced; and 4. Parallel A/D conversion is used to convert the analog difference signal to obtain a digital representation of the LSB group.

Although the serial-parallel A/D converter represents a compromise which provides conversion speeds which are faster than exclusively serial A/D converters and which have reduced circuit complexity and component count from exclusively parallel A/D converters, the circuit delay times required in past converters of this type have made them too slow for very high speed applications such as color video encoding or interfacing with a high-speed microprocessor. Thus, it has remained a problem to obtain an effective design for an A/D converter which is simple enough in circuit configuration and low enough in component count to be implemented as a monolithic integrated circuit but which is also capable of high-speed operation.

Assignee's co-pending patent application No. 1 listed above describes one approach by which improved conversion speeds are obtained by overlapping the conversion operation required to produce a MSB and LSB group in a serial-parallel A/D converter. In this approach, the active comparator output associated with MSB group conversion is used to switch the appropriate voltage reference value to the input of a voltage subtractor to obtain the analog difference signal required for LSB group conversion. In addition to the speed advantages inherent in the system configuration itself, the approach obtains improved speeds through the use of differential current switching both to obtain a high-speed latching comparator and to rapidly switch voltage reference values as required for the voltage subtraction. Although this approach works well, alternative system designs are possible which supply the reference values required for generating the analog difference signal in a different way thereby eliminating the requirement for precision differential current switches in the voltage subtractor.

SUMMARY

Accordingly, it is an object of this invention to provide an improved serial-parallel A/D converter which obtains improved conversion speeds through the use of overlapping operations and in which the MSB group comparison generates a reference current whose magnitude is representative of the reference voltage to be subtracted from the analog input signal to obtain the analog difference signal required for the LSB group comparison.

It is a further object of this invention to provide an improved serial-parallel A/D converter which is amenable to implementation as a monolithic integrated circuit.

Briefly described, the present invention is a serial-parallel A/D converter in which a first parallel A/D converter means uses a comparator coupled to an analog input signal to produce a quantized signal which is then encoded to produce the MSB group of the digital output representation of the applied analog input. Precision current matching circuits responsive to the individual stages of the MSB comparator couple to a current summing node and thereby establish a reference current whose magnitude corresponds to the reference voltage value identified by the MSB group comparator. The reference current and the applied analog input couple as inputs to a voltage subtractor whose output is an analog difference signal. The analog difference signal provides the input for a second parallel A/D converter means whose output is the LSB group digital representation of the applied analog input. The analog difference signal appears at the output of the voltage subtractor simultaneously with the encoding of the digital representation of the MSB group such that the operation of the first parallel A/D converter means and the operation of the second parallel A/D converter means is overlapped in time, thereby obtaining increased conversion speeds.

BRIEF DESCRIPTION OF THE DRAWINGS

FIG. 11 is a circuit diagram of the compare-latch command generator of FIG. 1.

DETAILED DESCRIPTION

Figure 1:
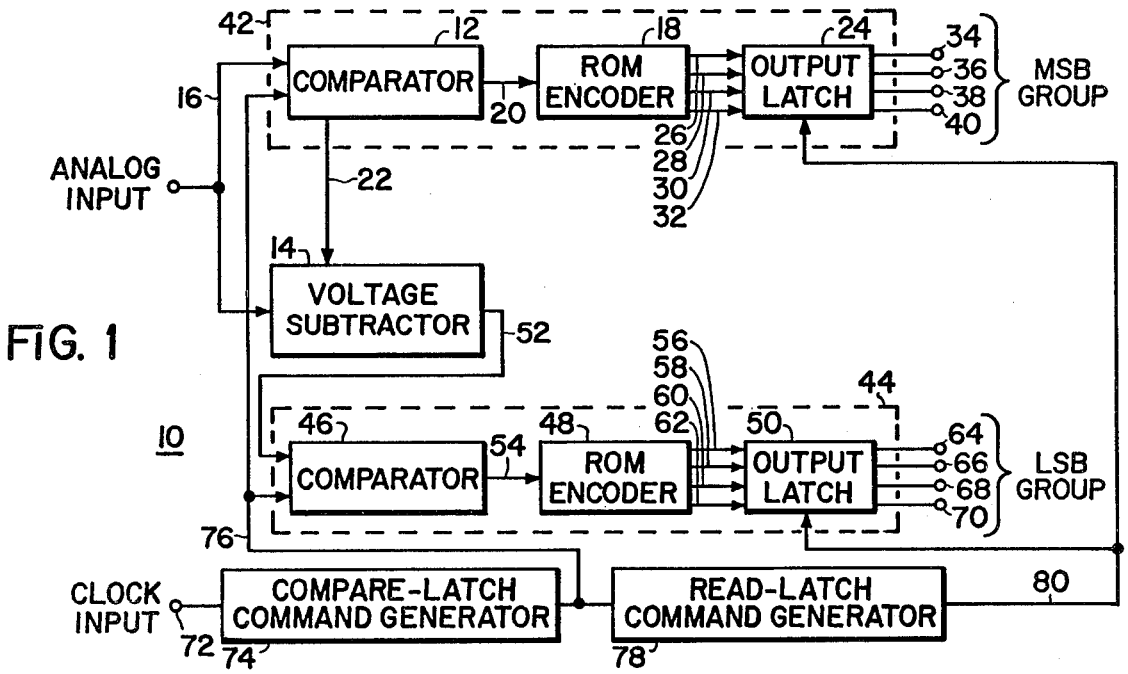
FIG. 1 is a block diagram of an analog-to-digital converter according to the invention.

FIG. 1 shows a serial-parallel A/D converter 10 according to the present invention. FIG. 1 is a functional block diagram and, as such, a single line interconnecting functional blocks may represent a single conductor or a multiplicity of conductors as will be made clear by the subsequent detailed description. Power supply and reference voltage connections are also omitted from FIG. 1 in the interest of simplicity.

In FIG. 1, an analog input couples to a first comparator 12 and a voltage subtractor 14 via conductor 16. The output of comparator 12 couples to ROM encoder 18 via line 20, which represents a multiplicity of conductors. A reference current generated within comparator 12 is coupled to voltage subtractor 14 via conductor 22. ROM encoder 18 couples to output latch 24 via conductors 26, 28, 30 and 32. Output latch 24 produces a digital output representation on conductors 34, 36, 38 and 40 which form the most significant bit (MSB) group output of the first parallel A/D converter means 42 formed by comparator 12, ROM encoder 18 and output latch 24. A second parallel analog-to-digital converter means 44 is formed by comparator 46, ROM encoder 48 and output latch 50. Conductor 52 couples the analog difference output signal of voltage subtractor 14 to an input of comparator 46. Line 54, which represents a multiplicity of conductors, couples the output of comparator 46 to the input of ROM encoder 48. Conductors 56, 58, 60 and 62 couple the outputs of ROM encoder 48 to the inputs of output latch 50. The outputs of output latch 50 are coupled to conductors 64, 66, 68 and 70 to form the least significant bit (LSB) group output of analog-to-digital converter circuit 10. Conductor 72 couples a clock input to a compare-latch command generator 74, and line 76, which represents a multiplicity of conductors, couples the output of compare-latch command generator 74 to the input of first comparator 12, the input of second comparator 46 and the input of read-latch command generator 78. Line 80, which represents a multiplicity of conductors, couples the output of read-latch command generator 78 to the inputs of output latch 24 and output latch 50.

In order to explain the operation of serial-parallel A/D converter 10 and the particular advantages it offers for high-speed operation, a general overview of the functional operation of each of the elements of FIG. 1 will be given. As described in the Background of the Invention portion above, serial-parallel A/D converters make use of one parallel converter to obtain the MSB group digital representation and a second parallel converter to obtain the LSB group digital representation. Thus, FIG. 1 shows a first converter 42 producing the MSB group representation on the conductors 34, 36, 38 and 40, and a second converter 44 producing the LSB group representation on conductors 64, 66, 68 and 70. Each of these converters contains similar functional elements. In converter 42 a comparator 12 compares the analog input on conductor 16 with a series of internal reference voltage values to produce a comparator output on one of the conductors forming line 20 which, in this case, represents sixteen separate comparator output conductors. These comparator output conductors provide the input to ROM encoder 18. ROM encoder 18 responds to the particular active comparator output to produce a digital representation; for example, a 4-bit binary representation, on conductors 26, 28, 30 and 32 which are then buffered by output latch 24 whose outputs are the MSB group digital representation. Parallel converter 44 contains similar functional elements in comparator 46, ROM encoder 48 and output latch 50, except that comparator 46 responds to the analog difference signal produced by voltage subtractor 14 rather than the analog input.

The high-speed analog-to-digital conversion obtainable with the configuration of FIG. 1 derives from the individual functional elements which are individually adapted for high-speed operation and, more particularly, from the particular system arrangement which provides for a time overlap in the operation of the second parallel converter means 44 with respect to the first parallel converter means 42. Thus, as is described in greater detail below, the reference current produced by comparator 12 allows the analog difference signal produced by voltage subtractor 14 on conductor 52 to initiate the action of the second parallel converter means 44 concurrently with the action of ROM encoder 18 and output latch 24. The basic timing for these concurrent operations is provided by compare-latch command generator 74 which provides "compare" and "latch" timing signals which couple to comparator 12 and comparator 46. These timing signals also couple to read-latch command generator circuit 78 which produces an output clock or strobe signal for output latch 24 and output latch 50, thereby synchronizing the operation of A/D converter circuit 10 such that the digital representation of the MSB group and the LSB group are both available at the same time. Given this framework, the particular advantages of an A/D converter system which provides high-speed operation through time overlapping parallel conversions using a reference current to provide a simple voltage subtraction configuration will now be explained in terms of the detailed structure and operation of the comparator circuit of FIG. 2 and the voltage subtractor circuit of FIG. 3.

Figure 2:
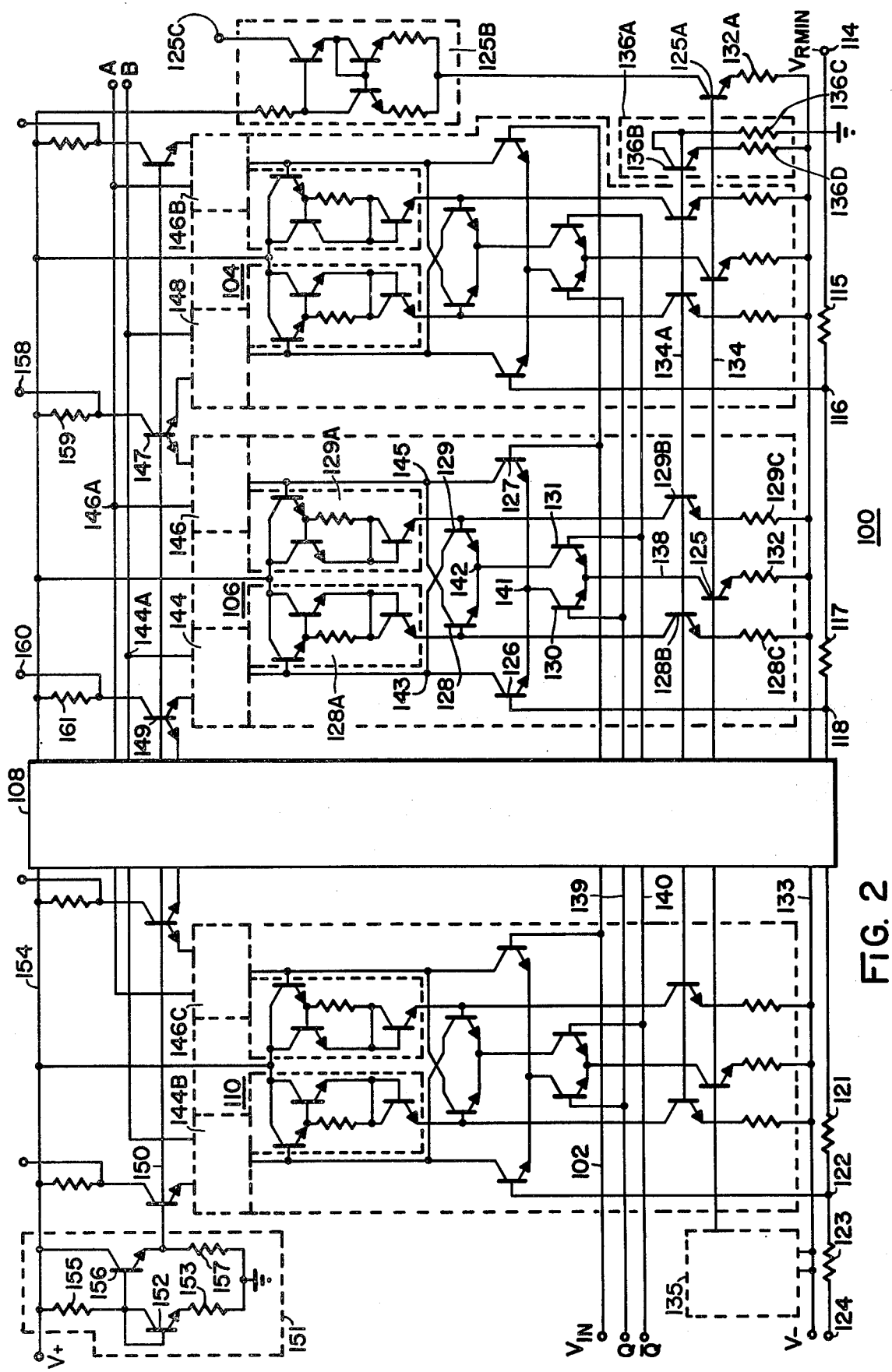
FIG. 2 is a circuit schematic diagram of a comparator which can be used to provide comparator 12 shown in the embodiment of FIG. 1.

FIG. 2 shows one particular embodiment of a high-speed comparator circuit which can be used as comparator 12 in the A/D converter circuit of FIG. 1. The basic function of the comparator circuit of FIG. 2 is to compare the applied analog input voltage to a series of voltage reference values to produce a MSB group digital output. If the number of bits in the MSB group digital output is designated M, the applied input voltage will be compared to $2^M-1$ voltage reference values using $2^M-1$ comparator stages. Thus, for the 4 bit MSB group embodiment of FIG. 2, the function is accomplished using fifteen comparator stages. Each of the comparator stages contains identical circuitry and, for simplicity in the drawing, FIG. 2 shows the detailed circuit structure and interconnections of only three of these comparator stages which are, accordingly, representative of the others. Thus, as shown, the applied analog input signal couples via conductor 102 to a first comparator stage 104, a second comparator stage 106 and additional 12 comparator stages which are part of block 108 not shown specifically, and a fifteenth comparator stage 110. The reference voltage values for each comparator stage are generated by a series connected resistive ladder. This ladder is formed by a first terminal 114 which couples to resistor 115 which couples to terminal 116 which, in turn, couples to resistor 117 which couples to terminal 118, etc. This series interconnection continues for twelve additional resistors which are included in block 108, but not shown, and then continues with a connection to resistor 121 which couples to node 122 which couples to resistor 123 which couples to terminal 124. Thus, the connection of a minimum reference voltage value to terminal 114 and a maximum voltage reference value to terminal 124 produces a series of reference voltage values between the minimum and the maximum at each of the recited nodes.

The structure and operation of comparator circuit 100 will now be explained in terms of the structure and operation of individual comparator stage 106. Comparator stage 106 comprises a constant current source transistor 125, a pair of common emitter input transistors 126 and 127, a pair of regenerative latching transistors 128 and 129 and a pair of compare-latch mode selection transistors 130 and 131. The emitter of first current source transistor 125 couples to resistor 132 which, in turn, couples to a power supply conductor 133 which couples to the V− power supply. The base of constant current source transistor 125 connects to conductor 134 which couples in common to the bases of each of the first constant current source transistors in each of the other comparator stages. Conductor 134 also couples to the output of precision constant current generator 135, which establishes the required operating reference current level for each of the first constant current source transistors connected to conductor 134.

Figure 4:
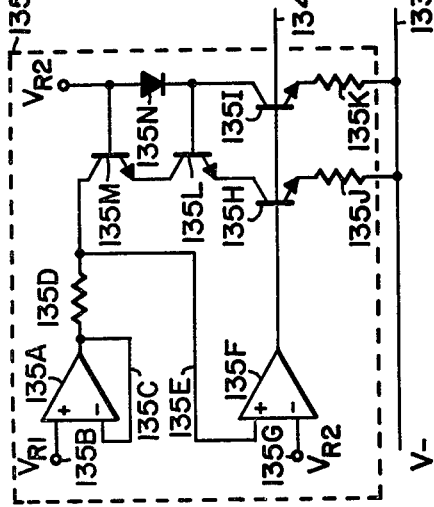
FIG. 4 is a detailed circuit diagram of the precision current source shown in FIG. 2.

FIG. 4 shows the detailed structure of precision constant current generator circuit 135. A first operational amplifier 135A has a first differential input which couples to reference voltage $V_{R1}$ via conductor 135B. A second differential input of operational amplifier 135A couples to the amplifier output via conductor 135C which also couples to a first terminal of resistor 135D. A second terminal of resistor 135D couples to conductor 135E which couples to a first differential input of a second operational amplifier 135F. A second differential input of operational amplifier 135F couples to reference voltage $V_{R2}$ via conductor 135G. The output of operational amplifier 135F couples to conductor 134 which couples to the base of transistor 135H and the base of transistor 135I and which forms the output of precision constant current generator circuit 135 as shown in FIG. 2. The emitters of transistors 135H and 135I couple to V- power supply conductor 133 via resistors 135J and 135K, respectively. The collector of transistor 135H couples to the emitter of transistor 135L whose base couples to the collector of transistor 135I and whose collector couples to the emitter of transistor 135M. The collector of transistor 135M couples to conductor 135E. The base of transistor 135L couples to the cathode of diode 135N whose anode couples to the base of transistor 135M and to reference voltage value $V_{R2}$.

In general, the voltage difference between the voltages applied to the inputs of operational amplifiers 135A and 135F is 2 $V_{rd}$ where $V_{rd}$ is the voltage difference between adjacent reference voltages. For a comparator having M output bits, $$V_{rd} = (1/2^M)[(V_{REF})_{MAX} - (V_{REF})_{MIN}]$$

As a result, the circuit of FIG. 4 generates a constant current:

$$I_c = 2V_{rd}/R1$$

where R₁=the resistance value of resistor 135D. The current sources in each individual comparator stage such as transistor 125 and precision resistor 132 (having value R1) in comparator stage 106 each generate an identical current $I_c$. The collector of constant current source transistor 125 couples to conductor 138 which in turn couples to the emitters of compare-latch mode selection transistors 130 and 131. The base of transistor 130 couples to conductor 139 which is the compare mode clock conductor which couples in the same manner to each of the individual comparator stages. The base of transistor 131 couples to conductor 140 which is the latch mode clock conductor which couples to each of the individual comparator stages. The collector of transistor 130 couples to conductor 141 which in turn couples to the emitters of input transistors 126 and 127. The collector of transistor 131 couples to conductor 142 which, in turn, couples to the emitters of regenerative latching transistors 128 and 129. The collector of input transistor 126 couples to conductor 143 which couples to the collector of regenerative latching transistor 129, a first terminal of level shifting circuit 128A and a first terminal of current splitting circuit 144. The collector of input transistor 127 couples to conductor 145 which couples to the collector of regenerative latching transistor 128, a first terminal of level shifting circuit 129A and to a first terminal of current splitting circuit 146. A second terminal of current splitting circuit 146 couples to a first emitter of output transistor 147. A second emitter of output transistor 147 couples to current splitting circuit 148 which is part of comparator stage 104. A second terminal of current splitting circuit 144 couples to a first emitter of output transistor 149. A second emitter of output transistor 149 couples to the current splitting circuit of a similar comparator stage (not shown) within block 108.

A third terminal of current splitting network 144 couples to conductor 144A which is a first reference current or first D/A current summing output of comparator circuit 100. Conductor 144A couples to a third terminal of current splitting network 148 in comparator stage 104, to a third terminal of current splitting network 144B in comparator stage 110 and to similar current splitting network third terminals (not shown) in each of the comparator stages represented by block 108. Similarly, a third terminal of current splitting network 146 couples to conductor 146A which is a second reference current or second D/A current summing output of comparator circuit 100. Conductor 146A couples to a third terminal of current splitting network 146B in comparator stage 104, to a third terminal of current splitting network 146C in comparator stage 110 and to similar current splitting network third terminals (not shown) in each of the comparators stages represented by block 108.

Figure 5:
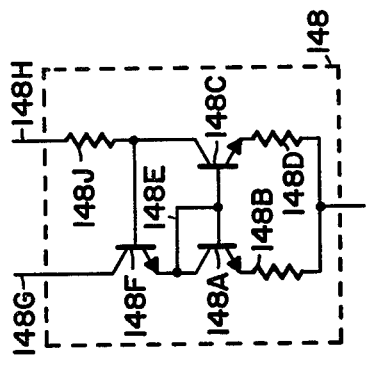
FIG. 5 is a representation circuit schematic diagram of the current splitting networks shown in FIG. 2.

FIG. 5 shows the detailed circuit structure of a particular current splitting network 148. This structure and its corresponding operation is identical to the other current splitting networks of comparator circuit 100 such as current splitting network 144, 146, etc. In current splitting network 148, the emitter of transistor 148A couples to the first terminal of a resistor 148B and the emitter of transistor 148C couples to the first terminal of resistor 148D. The second terminal of resistor 148B and the second terminal of resistor 148D couple together to form a first terminal of current splitting network 148. The collector of transistor 148A couples to conductor 148E which couples to the base of transistor 148A, the base of transistor 148C and the emitter of transistor 148F. The base of transistor 148F couples to the collector of transistor 148C and to a first terminal of resistor 148J whose second terminal couples to conductor 148H which forms a second terminal of current splitting network 148. The collector of transistor 148F couples to conductor 148G which forms a third terminal of current splitting network 148. The function of the current splitting network is to properly distribute precision matched currents to the D/A current summing outputs and at the same time allow the proper single high level comparator output (described below) to be generated. Thus, current splitting networks are inserted in both the left hand and right hand sides of each comparator stage as shown in FIG. 2. In the current splitting network as represented by FIG. 5, the transistors 148A, 148C and 148F are all identical and resistor 148B is equal to resistor 148D. Denoting the split current in the third terminal formed by conductor 148G as $I_1$ and the split current in the second terminal formed by conductor 148H as $I_2$, and denoting the current gain of transistors 148A, 148C and 148F by $\beta$, the resulting relation between the split currents is:

$$\frac{I_2}{I_1} = 1 + \frac{2}{\beta(\beta + 2)}$$

or, for $\beta > 100$:

$$I_2/I_1 \simeq 1$$

In the network, resistors 148B and 148D serve to linearize the device characteristics by minimizing any base emitter voltage mismatches between transistors and by increasing the differential gain during comparison.

Turning again to FIG. 2, the base of output transistor 147 and the base of output transistor 149 are each coupled to an output bias voltage conductor 150 which also couples to the bases of similar output transistors for each of the individual comparator stages. This output bias voltage is generated by circuit 151 in which the emitter of transistor 152 is coupled via resistor 153 to ground and the base of transistor 152 couples to the collector of transistor 152 and to V+ power supply conductor 154 via resistor 155. The collector of transistor 152 couples to the base of transistor 156 whose collector couples to the V+ power supply via conductor 154 and whose emitter couples to conductor 150 and to resistor 157 which in turn couples to ground.

Referring again to representative comparator stage 106 in FIG. 2, the collector of output transistor 147 couples to conductor 158 which is one of the multiplicity of conductors forming comparator output 20 previously mentioned in the discussion for FIG. 1. Conductor 158 also couples to a first terminal of an output resistor 159 whose second terminal couples to V+ power supply conductor 154. In a similar manner, the collector of output transistor 149 couples to conductor 160 which is another of the multiplicity of conductors forming the output of the comparator circuit. Conductor 160 also couples to a first terminal of resistor 161 whose second terminal couples to V+ power supply conductor 154.

Figure 7:
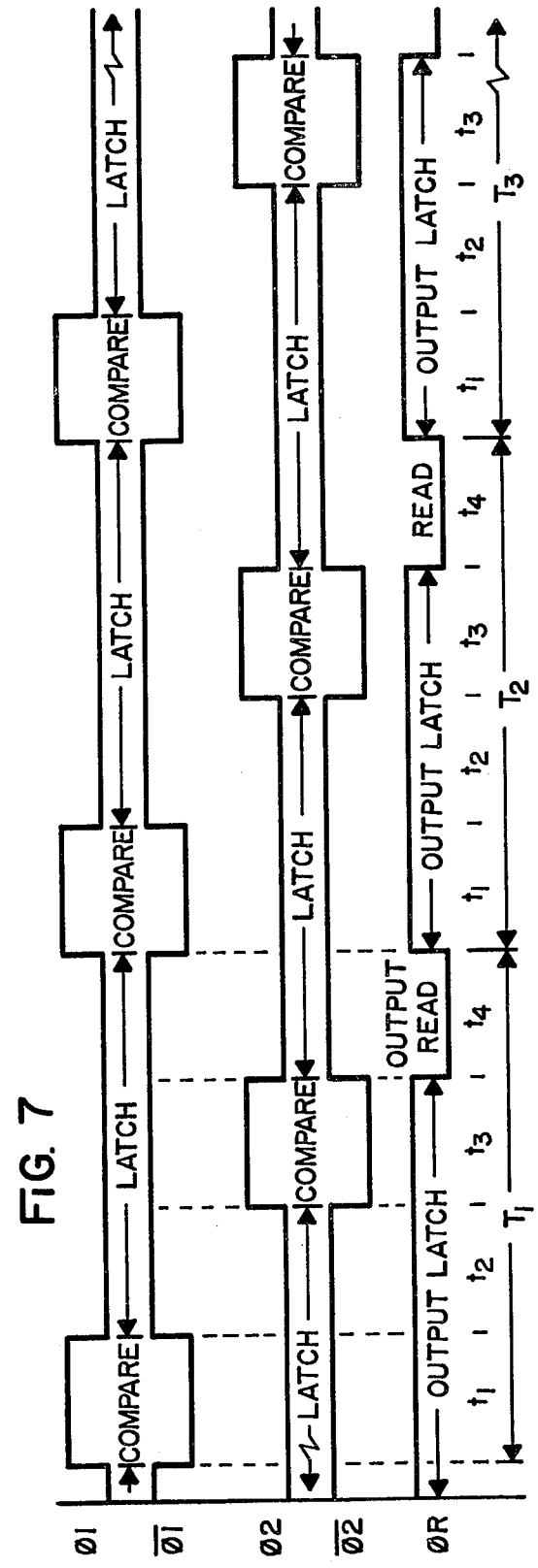
FIG. 7 is a timing diagram which is useful in describing the operation of the invention.

Turning now to the operation of the comparator circuit of FIG. 2, as typified by the operation of representative comparator stage 106, it should first be noted that the comparator stage has two fundamental modes of operation, the compare mode and the latch mode. The compare mode is defined by a high level on the compare clock conductor 139 and a low level on the latch clock conductor 140. Conversely, the latch mode is defined by a low level on conductor 139 and a high level on conductor 140. The clock timing waveforms of FIG. 7 illustrate the relationship between these two clock signals. The compare-latch mode selecting transistor pair 130 and 131 determines whether comparator stage 106 is in the compare mode or the latch mode by supplying the current value defined by constant current transistor 125 to the emitters of either the "compare" emitter-coupled transistors 126 and 127 or to the "latch" emitter-coupled transistor pair 128 and 129. Since the clock signals on conductors 139 and 140 are complements (see FIG. 7) only the compare transistors or the latch transistors will be active at any one time. In the compare mode, the analog input voltage present on conductor 102, which couples to the base of transistor 127, is compared to the reference voltage value present on conductor 118 which couples to the base of transistor 126. The coupling between the emitters of transistors 126 and 127 form a differential amplifier. When the applied analog input voltage on conductor 102 is more than the reference voltage value on conductor 118, the collector current of transistor 127 will be greater than the collector current of transistor 126 and, as a result, a plus to minus differential voltage will be produced between conductors 143 and 145. Conversely, if the applied analog input voltage coupled to the base of transistor 127 is less than the reference voltage applied to the base of transistor 126, a minus to plus differential voltage will be produced between conductors 143 and 145. Thus, in the compare mode the polarity of the differential voltage developed between the collector of transistor 126 and the collector of 127 indicates whether the applied analog input signal applied to comparator stage 106 is greater than, or less than, the reference voltage value applied to that same stage.

The second terminal of level shifting network 128A couples to the base of regenerative latching transistor 128 and also couples to the collector of current source transistor 128B. In a similar fashion, a second terminal of level shifting network 129A couples to the base of regenerative latching transistor 129 and also couples to the collector of current source transistor 129B. The bases of constant current source transistors 128B and 129B couple to conductor 134A which is the output of constant current generator circuit 136A. In constant current generator 136A, conductor 134A couples to the base of transistor 136B which in turn couples to the collector of transistor 136B and to a first terminal of resistor 136C. A second terminal of resistor 136C couples to ground. The emitter of transistor 136B couples to a first terminal of resistor 136D whose second terminal couples to the V− power supply. The emitters of constant current source transistors 128B and 129B couple to the V− power supply via resistors 128C and 129C respectively. A third terminal of level shifting network 128A and a third terminal of level shifting network 129A couple in common to V+ power supply conductor 154.

Figure 6:
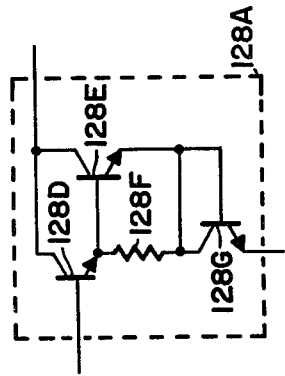
FIG. 6 is a representation circuit schematic diagram of the voltage level shifting networks shown in FIG. 2.

FIG. 6 shows the detailed circuit structure of a level shifting circuit suitable for use as circuit 128A or circuit 129A in the representative comparator stage 106. The circuit uses three identical transistors. The first terminal of the level shifting network couples to the base of transistor 128D whose emitter couples to the base of transistor 128E and to a first terminal of resistor 128F. The emitter of transistor 128E couples to the base and collector of transistor 128G whose emitter forms the second terminal of the level shifting circuit. The collector of transistor 128D couples to the collector of transistor 128E to form the third terminal of the level shifting network. When the level shifting network is arranged such that a constant current source is connected to the second terminal and the third terminal is connected to a V+ power supply, the circuit functions to provide a path for the constant current to flow from the first terminal to the second terminal with a specified voltage drop or level shift between the first terminal and the second terminal. By this operation, saturation is prevented when the comparator stages are in the latch mode, thereby increasing switching speed and also preserving the summing current accuracy needed for correct functioning of the D/A summing current outputs.

A key feature in the speed of operation of each comparator stage and, thus, of the overall comparator circuit is the use of latching transistors 128 and 129. when the compare-latch clock signals switch such that the level of the compare clock conductor 139 goes from high to low, the level of the latch clock conductor 140 goes from low to high (see FIG. 7). When the clock switches, transistor 130 switches to the nonconducting state and, simultaneously, transistor 131 switches to the conducting state such that latch transistors 128 and 129 are enabled. The regenerative cross-coupling formed by conductors 143 and 145 acts to reenforce the polarity of any differential voltage established between the collectors of transistors 126 and 127 in the compare mode and, thus, store or "latch" the results of the comparison. Assume, for example, that the input voltage applied via conductor 102 is only slightly greater than the reference voltage value on conductor 118 so that at the end of the compare interval the collector of transistor 126 is only a few millivolts more positive than the collector of transistor 127. As the circuit enters the latch mode interval and transistors 128 and 129 begin to conduct, the slightly more positive voltage on conductor 143 will cause greater conduction in transistor 128 and less conduction in transistor 128 with the result that conductor 143 will become even more positive with respect to conductor 145. This regenerative effect proceeds rapidly until transistor 129 is nonconducting and transistor 128 is conducting. The speed inherent in a differential amplifier configuration which makes use of current switching together with the "snap" action of a latch circuit, which uses regeneration to capture the results of a fast comparison, are combined to provide a particularly useful high-speed comparator configuration.

High speed and a simple circuit configuration are further provided by the comparator circuit of FIG. 2 through the use of multiple emitter output transistors such as transistor 147 and transistor 149. Each of the individual comparator stages functions in the manner previously described for representative stage 106 and in the latch interval, each stage will assume one of two possible states defined by the presence or absence of current in the current splitting load networks such as representative networks 144 and 146. If, during the compare interval, the applied analog input voltage on conductor 102 was greater than the reference voltage value on conductor 118, during the latch mode network 146 will conduct essentially all of the current flowing through constant current source transistor 125 and network 144 will conduct essentially no current. Conversely, if the applied analog input voltage on conductor 102 is less than the reference voltage value on conductor 118, network 146 will conduct essentially no current.

Now consider the case where the applied analog input voltage has a value which is greater than the reference voltage value on conductor 116 but less than the reference voltage value on conductor 118. During the latch interval, this value of applied analog input voltage will result in essentially no current in network 146 and no current in network 148. This means that no current can flow in either emitter of transistor 147 so that there is no current in the collector of transistor 147, and resistor 159 pulls output conductor 158 to a high level. Since all comparator stages to the left of comparator stage 106 couple to reference voltage values which are greater than the applied analog input voltage on conductor 102, they will all be latched into a conducting state which is the same as that described for stage 106 and, as a result, the multiple emitter output transistors corresponding to the stages will each have at least one conducting emitter so that all of the output conductors of comparator output 20, except for conductor 158, will be held in the low state. Thus, the multiple emitter output transistor structure shown in FIG. 2 provides a simple and high-speed method for producing an output signal on a single one of a multiplicity of output conductors which indicates the value of an applied analog input voltage with respect to a series of reference voltage values.

The overall effect of the current splitting networks such as current splitting network 144 and 146 of comparator stage 106 will now be considered. As noted above, each current splitting network generates matched currents and for each comparator stage the current splitting networks analogous to current splitting network 146 couples these matched currents to conductor 146A which forms the D/A current summing output of comparator 100. For convenience in discussion, the current in conductor 146A is designated $I_A$. In a similar fashion, the current splitting networks analogous to current splitting network 144 in each comparator stage couple in common to conductor 144A which forms the complementary D/A current summing output of comparator circuit 100. For convenience, the current in conductor 144A will be designated $I_B$. As noted above, the current in each comparator stage is determined by the collector current of a constant current source transistor analogous to transistor 125 in comparator stage 106. This constant current is designated $I_C$. For each individual comparator stage, if the input voltage is larger than the reference voltage then the constant current $I_C$ conducts through the transistor analogous to transistor 127 in comparator stage 106 and, because of the current splitting, one-half of this current goes in the third terminal of current splitting network analogous to current splitting network 146 in comparator stage 106 to contribute to the total D/A summing current in conductor 146A. In similar fashion, if the input voltage is smaller than the reference voltage then one-half of the constant current $I_C$ is contributed to the $I_B$ current flowing in conductor 144A.

The comparator circuit of FIG. 2 also includes an additional reference current generating circuit useful for some inventive embodiments. This circuit comprises constant current source transistor 125A having a base coupled to current reference conductor 134, having an emitter coupled to a first terminal of precision resistor 132A and having a collector coupled to a first terminal of current splitting network 125B. Detailed circuit structure of the current splitting network is shown in FIG. 5. A second terminal of precision resistor 132A couples to the V— power supply conductor. A second terminal of current splitting network 125B couples to V+ power supply conductor 154 and a third terminal of current splitting network 125B couples to conductor 125C to form a reference current output for the circuit. Because of the precision matching of transistor 125A and resistor 132A with the similar constant current circuits in each of the comparator stages, the current in the collector of transistor 125A has the value $I_c$ and, because of the current splitting network 125B, the resultant current in output conductor 125C has the value $I_c/2$. This additional reference current is useful for certain system configurations employing the comparator of FIG. 2.

Thus, $I_A$ is the sum of the comparator currents where the input voltage is larger than the reference voltage, and $I_A$ therefore represents a count of all the digital levels less than the input level. Similarly, $I_B$ represents a count of all digital levels above the input voltage. These currents thus constitute the D/A outputs needed for a subsequent serial stage of A/D conversion which can be subtraction or reference voltage level shifts. The use of comparator stages which include current splitting networks analogous to network 144 combined with level shifting networks analogous to 128A are of particular advantage in obtaining high-speed conversion in a parallel-serial A/D converter. The advantage is derived from the fact that the D/A current summing outputs described above are generated as part of the current switching inherent in the operation of the latching comparator. The high speed inherent in current switching of this type is further enhanced through the use of level shifting circuits analogous to level shifting circuit 128A to prevent saturation and to eliminate distortion in the constant current value being switched. The availability of precision D/A current sum outputs make it possible to implement parallel-serial A/D converters which operate at high speeds by using relatively simple circuit structures to accomplish the voltage subtraction or reference voltage level shifting operations required for serial operations.

As previously discussed, the key to the high A/D conversion speeds obtained by the present invention is the time overlap or coincidence of the parallel conversion of the MSB group digital output and the LSB group digital output. This time overlap is obtained by using intermediate outputs obtained during the process of the MSB group conversion to determine the particular reference voltage value which must be subtracted from the applied analog input to obtain the analog difference signal required for the parallel conversion of the LSB group output. Assignee's co-pending patent application No. 1 listed above describes one approach by which improved conversion speeds are obtained by overlapping. The approach of the present invention differs in that the comparator circuit used for the parallel conversion of the MSB group digital output includes a D/A current summing output $I_A$ whose magnitude represents a count of all the reference voltage values which are less than the applied input value.

Thus, in summary, the comparator of FIG. 2 simultaneously performs the flash encoding of the first most significant bits (i.e., a digital output) and also generates an analog representation of this digital signal which is suitable for subtraction or level shifting (an analog output). The comparator may be described as follows:
1. Number of bits = M
2. Assume input voltage is between the two reference voltages associated with the $n^{th}$ comparator stage:

$$V_{r(n)} < V_{in} < V_{r(n+1)}.$$

3. Number of voltage comparators $= 2^M - 1$.
4. The voltage difference between two adjacent references:
$$V_{rd} = 1/2^M[(V_{REF})MAX - (V_{REF})MIN].$$

5. The constant current in each comparator:

$$I_c = 2V_{rd}/R1.$$

6. The input voltage $V_{in}$ is:

$$(n+1)V_{rd} + (V_{REF})MIN > V_{in} > nV_{rd} + (V_{REF})MIN$$

7. The summing current $I_A$ represents the D/A current output:

$$I_A = n(I_C/2) = n(V_{rd}/R1).$$

8. The summing current $I_B$ represents the complement of the D/A output:

$$I_B = [(2^M - 1) - n](\frac{I_C}{2}) = [2^M - (n+1)]\frac{V_{rd}}{R1}$$

9. The sum of the summing currents forms a constant current:

$$I_A + I_B = \text{constant} = (2^M - 1)(I_C/2)$$

Figure 3:
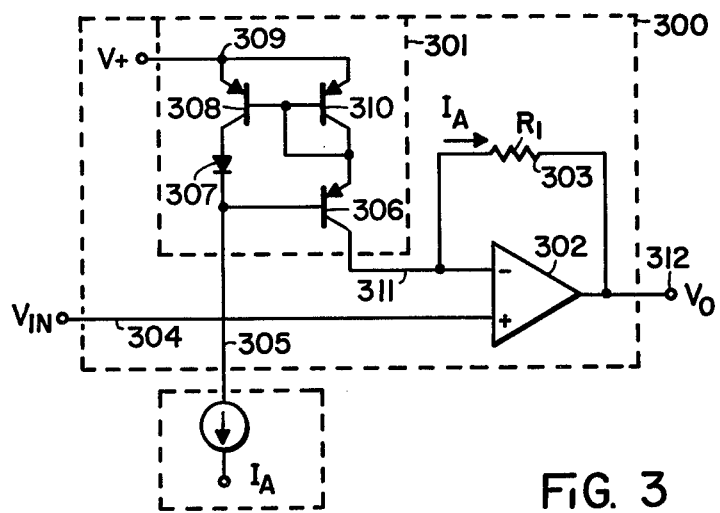
FIG. 3 is a circuit schematic diagram of a voltage subtractor circuit which can be utilized to provide voltage subtractor 14 shown in FIG. 1.

The availability of the summing current output $I_A$ offers a significant advantage in that high-speed operation can be obtained with a very much simpler voltage subtractor configuration. FIG. 3 shows such a voltage subtractor circuit 300 suitable for use in the present invention. As shown, the voltage subtractor consists of a current mirror circuit 301, an operational amplifier 302 and a feedback resistor 303. For the particular embodiment of FIG. 3, current mirror circuit 301 is implemented using PNP transistors. Conductor 304 couples the applied analog input voltage $V_{in}$ to one input of operational amplifier 302. Conductor 304 is equivalent to conductor 16 shown in FIG. 1 and to conductor 102 shown in FIG. 2. Conductor 305 couples the summing current output of the comparator to a first terminal of current mirror circuit 301. Conductor 305 is equivalent to conductor 22 shown in FIG. 1 or to conductor 146A shown in FIG. 2. In current mirror circuit 301, conductor 305 couples to the base of transistor 306 and to the cathode of diode 307. The anode of diode 307 couples to the collector of transistor 308 whose emitter couples to V+ power supply conductor 309 which also couples to the emitter of transistor 310. Conductor 309 is equivalent to V+ power supply conductor 154 shown in FIG. 2. The collector of transistor 310 couples to its own base, the base of transistor 308, and to emitter of transistor 306. The collector of transistor 306 couples to conductor 311 which forms a second terminal of current mirror circuit 301. Conductor 311 couples to a second differential input of operational amplifier 302 and to a first terminal of feedback resistor 303. A second terminal of feedback resistor 303 couples to conductor 312 which couples to the output of operational amplifier 302 and forms the $V_O$ output of voltage subtractor circuit 300. Conductor 312 corresponds to conductor 52 shown in FIG. 1.

Because of the action of current mirror circuit 301, the current in conductor 311 is identical to the current in conductor 305. Since the differential input of operational amplifier 302 coupled to conductor 311 conducts essentially no current, the $I_A$ summing current in conductor 305 results in a equal current in resistor 303. When the value of resistor 303 is chosen to have the value R1 defined above, the input-output relationship for voltage subtractor circuit 300 is given by the equation:

$$V_O = V_{in} - I_A R1 = V_{in} - nV_{rd}$$

Thus, it is seen that the simple and direct subtractor circuit of FIG. 3 produces a analog difference voltage $V_0$ as required for the LSB conversion in the serial-parallel conversion thereby providing overlapping operations for increased conversion speeds with a minimum of additional circuit complexity.

Figure 8:
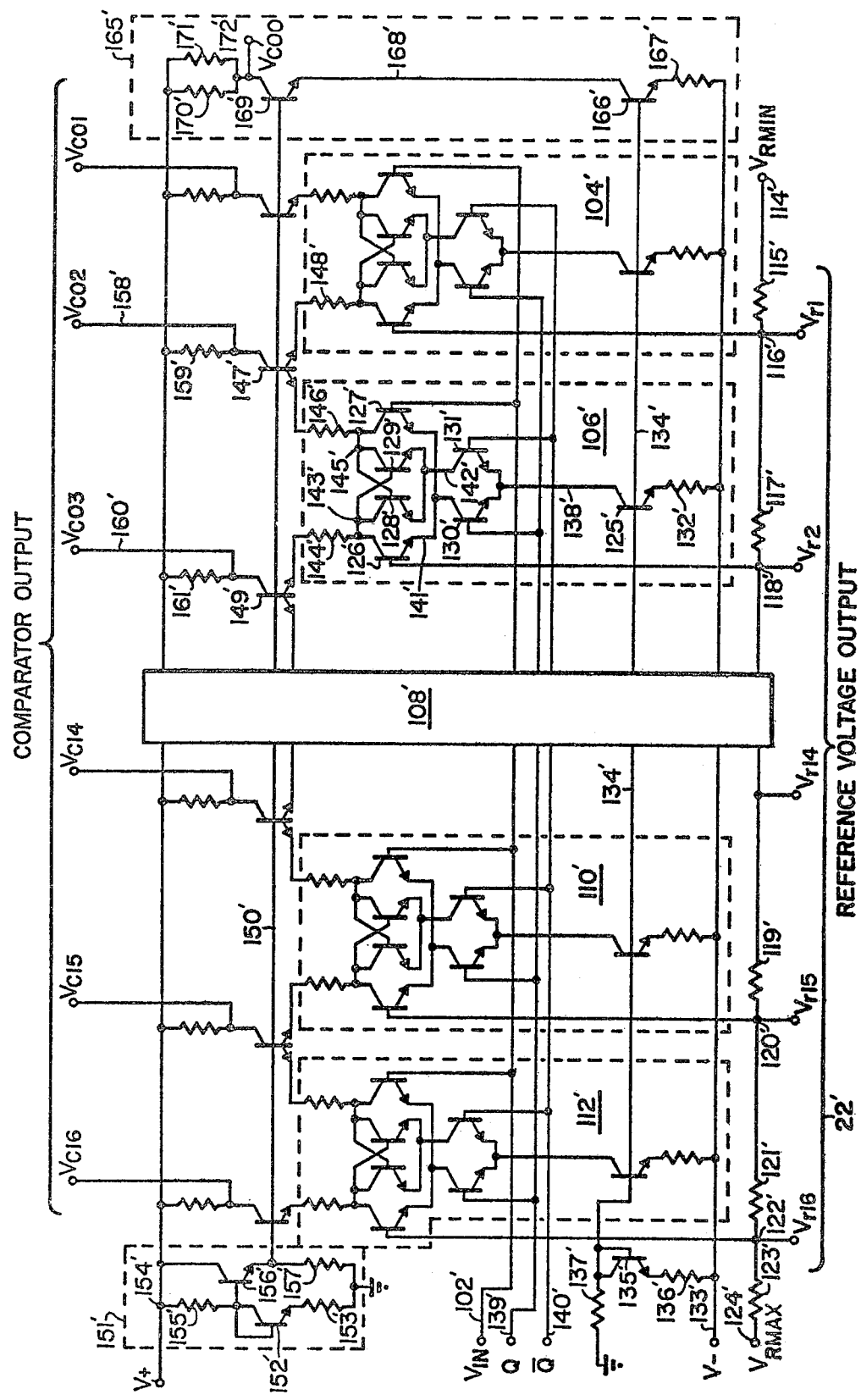
FIG. 8 is a circuit schematic diagram of a comparator which can be used to provide comparator 46 shown in the embodiment of FIG. 1.

FIG. 8 shows one particular embodiment of a high-speed comparator circuit which can be used as comparator 46 in the A/D converter circuit of FIG. 1. The basic function of the comparator circuit of FIG. 8 is to compare the applied analog input voltage to a series of voltage reference values to produce a digital output. For the particular embodiment of FIG. 8, this is accomplished using fifteen comparator circuits. Each of the comparator circuits contains identical circuitry and, for simplicity in the drawing, FIG. 8 shows the detailed circuit structure and interconnections of only four of these comparator circuits which are, accordingly, representative of the others. Thus, as shown, the applied analog input signal couples via conductor 102' to a first comparator state 104', a second comparator stage 106', an additional 11 comparator stages which are part of block 108' but not shown specifically, a fourteenth comparator stage 110', and a fifteenth comparator stage 112'. The reference voltage values for each comparator stage are generated by a series connected resistive ladder. The connection of a minimum reference voltage value to terminal 114' and a maximum voltage reference value to terminal 124' produces a series of reference voltage values between the minimum and the maximum at each of the recited nodes.

Turning now to the operation of the comparator circuit of FIG. 8, as typified by the operation of representative comparator stage 106, it should first be noted that the comparator stage has two fundamental modes of operation, the compare mode and the latch mode. The compare mode is defined by a high level on the compare clock conductor 139' and a low level on the latch clock conductor 140'. Conversely, the latch mode is defined by a low level on conductor 139' and a high level on conductor 140'. The clock timing waveforms of FIG. 7 illustrate the relationship between these two clock signals. The compare-latch mode selecting transistor pair 130' and 131' determines whether comparator stage 106' is in the compare mode or the latch mode by supplying the current value defined by constant current transistor 125' to the emitters of either the "compare" emitter coupled transistors 126' and 127' or to the "latch" emitter-coupled transistor pair 128' and 129'. Since the clock signals on conductors 139' and 140' are complements (see FIG. 7) only the compare transistors or the latch transistors will be active at any one time. In the compare mode, the analog input voltage present on conductor 102' which couples to the base of transistor 127' is compared to the reference voltage value present on conductor 118' which couples to the base of transistor 126'. The coupling between the emitters of transistors 126' and 127' form a differential amplifier. When the applied analog input voltage on conductor 102' in less than the reference voltage value on conductor 118', the collector current of transistor 127' will be greater than the collector current of transistor 126' and as a result the voltage developed across resistor 146' will be larger than the voltage developed across resistor 144'. Conversely, if the applied analog input voltage coupled to the base of transistor 127' is less than the reference voltage applied in the base of transistor 126', the voltage developed across resistor 144' will be greater than the voltage developed across resistor 146'. Thus, in the compare mode the polarity of the differential voltage developed between the collector of transistor 126' ands the collector of 127' indicates whether the applied analog input signal applied to comparator stage 106' is greater than or less than the reference voltage value applied to that same stage. The regenerative cross-coupling formed by conductors 143' and 145' acts to re-enforce the polarity of any differential voltage established between the collectors of transistors 126' and 127' in the compare mode and thus store or "latch" the results of the comparison. The speed inherent in a differential amplifier configuration which makes use of current switching together with the "snap" action of a latch circuit which uses regeneration to capture the results of a fast comparison are combined to provide a particularly useful high-speed comparator configuration.

High speed and a simple circuit configuration are further provided by the comparator circuit through the use of multiple emitter output transistors such as transistor 147' and transistor 149' shown in FIG. 8. Each of the individual comparator stages function in the manner previously described for representative stage 106, and in the latch interval each stage will assume one of two possible states defined by the presence or absence of current in the load resistors such as representative resistors 144' and 146'. If, during the compare interval, the applied analog input voltage on conductor 102' was greater than the reference voltage value on conductor 118' during the latch mode, resistor 146' will conduct essentially all of the current flowing through constant current source transistor 125' and resistor 144' will conduct essentially no current. Conversely, if the applied analog input voltage on conductor 102' is less than the reference voltage value on conductor 118', resistor 146' will conduct essentially no current. Now consider the case where the applied analog input voltage has a value which is greater than the reference voltage value on conductor 116' but less than the reference voltage value on conductor 118'. During the latch interval this value of applied analog input voltage will result in essentially no current in resistor 146' and no current in resistor 148'. This means that no current can flow in either emitter of transistor 147' so that there is no current in the collector of transistor 147' and resistor 159' pulls output conductor 158' to a high level. Since all comparator stages to the left of comparator stage 106' see reference voltage values which are greater than the applied analog input voltage on conductor 102' they will all be latched into a conducting state which is the same as that described for stage 106' and as a result the multiple emitter output transistors corresponding to these stages will each have at least one conducting emitter so that all of the output conductors of comparator output 20' except for conductor 158' will be held in the low state. Thus, the multiple emitter output transistor structure shown in FIG. 8 provides a simple and high-speed method for producing an output signal on a single one of a multiplicity of output conductors which indicates the value of an applied analog input voltage with respect to a series of reference voltage values.

Figure 9:
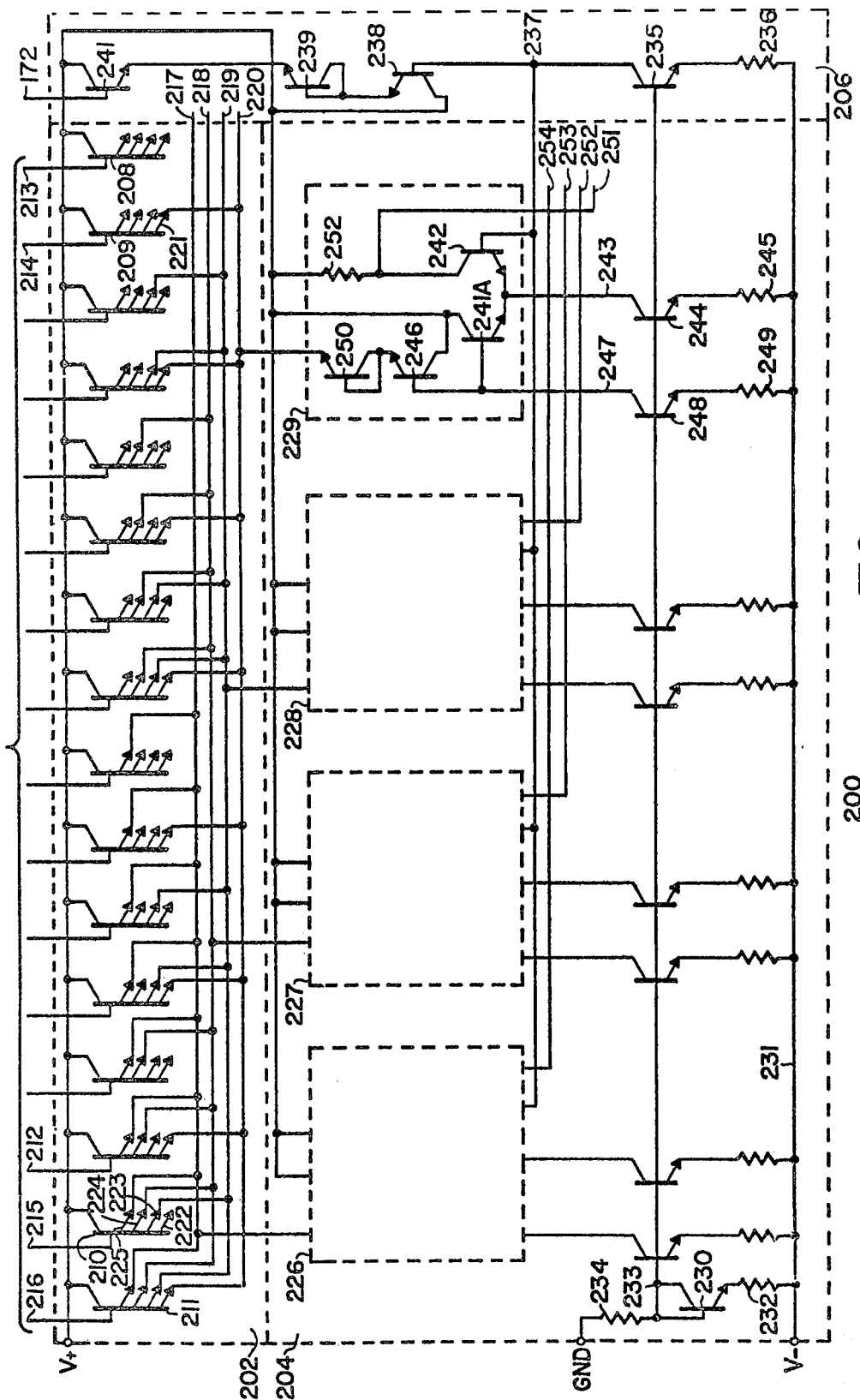
FIG. 9 is a circuit schematic diagram of an encoder which can be utilized to provide both encoders shown in FIG. 1.

The comparator circuit shown in FIG. 8 also includes a bias generating circuit 165' which is used for generating reference bias voltages used by the read-only memory encoder circuit (FIG. 9).

FIG. 9 shows one particular embodiment of a read-only memory encoder circuit which can be used to implement the A/D converter of the present invention. Read-only memory encoder circuit 200 comprises a read-only memory input section 202, an output section 104 and a bias voltage generator 206. Read-only memory input section 202 consists of a plurality of multiple emitter transistors. The number of multiple emitter input transistors corresponds to the number of digital outputs produced by the comparator circuit of the A/D converter. Thus, for the particular embodiment of FIG. 9, read-only memory input section 202 comprises sixteen multiple emitter input transistors. Transistors 208, 209, 210 and 211 are representative of these transistors as shown in FIG. 9, the collectors of all of the multiple emitter input transistors are coupled to a common V+ power supply conductor 212. Each of the conductors forming the plurality of digital outputs from the comparator circuit of FIG. 8 couples to the base of one multiple emitter input transistor. As previously discussed, the comparator circuit (FIG. 8) produces a plurality of digital output signals each of which represents a particular level of applied analog input signal. The particular arrangement of connections to the multiple emitters of the input transistors provide an encoding function by which a unique digital code is obtained for each comparator output signal and, thus, for each particular level of applied input signal. This arrangement of emitter connections is accomplished by providing a plurality of common conductors such as conductors 217, 218, 219 and 220. For the particular embodiment of read-only memory encoder 200, a binary code is used. Thus, the comparator output signal on conductor 213, which indicates that the applied analog input signal is greater than a first reference voltage value, couples to the base of multiple emitter transistor 208, which has none of its emitters coupled to the common conductors 217, 218, 219 and 220 and thus defines a binary code 0000. A comparator output signal on conductor 214, which indicates that the level of applied analog input voltage is greater than a second reference voltage value, coupled to the base of multiple emitter transistor 209 which has a first emitter 221 coupled to common conductor 220 thereby defining the binary code 0001. Similar emitter connections are used for the other multiple emitter transistors shown in read-only memory input circuit 202. A multiple emitter encoding arrangement such as shown in FIG. 9 is advantageous because coded representations of the applied analog input level, other than the binary code shown, can be readily obtained by simply changing the emitter interconnection arrangement used. In a monolithic integrated circuit, device structures incorporating several emitter device regions within a common base region or other similar techniques commonly employed in integrated circuit read-only memories provide a simple way to obtain the multiple emitter structure shown and make it easy to change the interconnection pattern as required by a new code.

Figure 10:
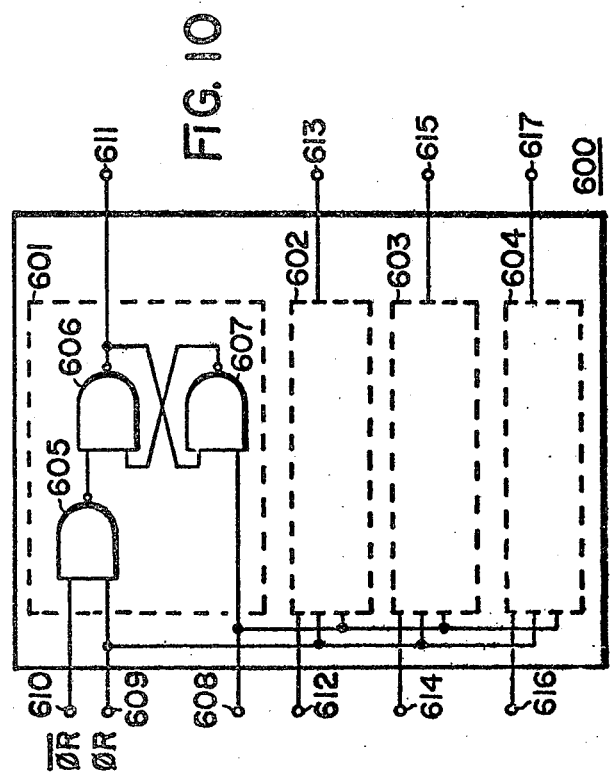
FIG. 10 is a logic diagram of output latches which can be utilized in the embodiment of FIG. 1.

The coded representation provided by the signals on each of the conductors 217, 218, 219 and 220 are coupled respectively to output circuits 226, 227, 228 and 229 which provide the amplification and level conversion required by the output latch circuit (FIG. 10 described below). Each of these output circuits operates using two constant current source transistors. The reference current for these constant current source transistors is provided by transistor 230 whose emitter couples to V− power supply conductor 231 via resistor 232 and whose base and collector are coupled to conductor 233. Conductor 233 couples to the bases of the constant current source transistors of each output circut and to a first terminal of resistor 234 whose second terminal couples to a power supply terminal (GND) which is ground for the particular embodiment of FIG. 9. Conductor 233 also couples to the base of constant current source transistor 235 which is part of reference voltage generating circuit 206.

As previously discussed, the reference bias voltage on conductor 172′ defines a level midway between the low and high levels of the comparator output, and reference voltage generating circuit 206 translates this voltage to the bias voltage present on conductor 237 thereby providing a trip point for high-speed current switching within each of the output circuits. The structure and operation of each of the output circuits is identical and will be described in terms of the operation of output circuit 229.

The heart of output circuit 229 is the differential amplifier formed by transistor 241A and 242. When the voltage at the base of transistor 241A is less than the voltage at the base of transistor 242, the constant current value established by constant current source transistor 244 and resistor 245 will be conducted by transistor 242, and the resulting voltage drop across resistor 252 will establish a low level on output conductor 251. As previously discussed, the operation of the comparator circuit results in a high level on one of the comparator output conductors, for example, conductor 214. The encoding function of the emitter connections of each of the multiple emitter transistors steers such a high level to the inputs of the appropriate output driver circuits. Thus, a high level on conductor 214 results in a high level at emitter 221 of multiple emitter transistor 209 which couples via conductor 220 to the input of output circuit 229. This high level is level shifted by transistor 250 and transistor 246 to produce the appropriate change in voltage at the base of transistor 241A. Transistor 246 and transistor 250 operate in an emitter base reverse breakdown mode, and resistor 249 is chosen such that a small constant current is conducted by constant current source transistor 248. This small current establishes a stable value of reverse breakdown voltage for transistor 246. As a result of the level shifted high level appearing at the base of transistor 241A, transistor 241A conducts the constant current value set by transistor 244, and transistor 242 becomes nonconducting so that the output level on conductor 251 changes from a low to a high level.

Circuit structures shown in FIG. 9 are particularly adapted to minimize the effects of temperature and process variations in the monolithic integrated circuit embodiment. The use of a current source, such as current source transistor 248, to establish a small stable current value to sustain the emitter base reverse breakdown voltage of the level shifter transistors tends to eliminate the effects of process variations. Also, the use of a common current source reference (conductor 233) for all output stages and in particular for the generation of the bias voltage on conductor 237 compensates for the effects of temperature and process variation. It also should be noted that transistor 250 can be eliminated in those applications where the additional level shifting it provides is not required.

The operation of each of the output circuits of read-only memory encoder 200 is the same as has been described for output circuit 229. Thus output circuit 228 responds to a high level on conductor 219 to produce a level shift at high level on output conductor 252, output circuit 227 responds to a high level on conductor 218 to produce a level shift at high level on output conductor 253 and output circuit 226 responds to a high level on conductor 217 to produce a level shifted high level on output conductor 254.

FIG. 11 shows a compare-latch command generator circuit 500 which can be used to implement the present invention. This circuit uses high-speed current switching to provide the high frequency compare and latch mode clock signals required by the comparator to accomplish the high-speed A/D conversion objectives of the present invention. As shown in FIG. 11, a clock input is level shifted by a zener diode 501 and coupled to a first differential amplifier formed by transistors 502 and 503. The collector of transistor 503 couples to Q1 output conductor 504 which is the compare mode clock for the most significant bit (MSB) comparator. Similarly, the collector of transistor 502 couples to the $\overline{Q1}$ output conductor 505 which is the latch mode clock for the most significant bit (MSB) comparator. The level shifted clock input also couples via conductor 506 to resistor 507 and capacitor 508. Resistor 507 and capacitor 508 form a delay line which delay the applied clock input prior to its being coupled to the differential amplifier formed by transistors 509 and 510. The collector of transistor 510 couples to Q2 clock conductor 511 which is the compare mode clock for the least significant bit comparator. Similarly, the collector of transistor 509 couples to the $\overline{Q2}$ clock conductor 512 which is the latch mode clock for the least significant bit comparator. It should also be noted in FIG. 11 that the collector load resistors of transistors 502 and 503 couple to ground power supply conductor 513 via transistor 514 while the collector load resistors of transistor 509 and 510 couple to V+ power supply conductor 515 via transistor 516. These differences in collector supply voltage provide compare mode and latch mode clock signals appropriate for each comparator. The time relationship of the compare mode and latch mode outputs of compare-latch command generator circuit 500 are shown in the timing diagram of FIG. 7.

In order that all bits of the digital representation appear simultaneously, the A/D converter circuit of the present invention includes an output latch circuit 600 and an output read/latch command generator circuit 700.

Referring to FIG. 10, output latch circuit 600 comprises four identical latch circuits 601, 602, 603 and 604.

The structure and operation of each latch circuit will be explained in terms of representative circuit 601 which comprises NAND gate 605, 606 and 607. NAND gates 606 and 607 are cross-coupled to form a latch. Conductor 608 couples the $\phi R$ clock signal generated by output read-latch command generator circuit 700 to an input of NAND gate 607. This signal forces the latch formed by NAND gate 606 and 607 to the "reset" state during the time interval $T_4$ shown in FIG. 7. Conductor 609 couples the $\overline{\phi R}$ clock signal generated by output read-latch command generator circuit 700 to an input of NAND gate 605. Conductor 609 is high during the time interval $t_4$ shown in FIG. 7 and thus enables NAND gate 605 during that time such that the digital data coupled to a second input of NAND gate 605 via conductor 610 is inverted and applied to the "set" input of the latch formed by NAND gates 606 and 607. At the end of time interval $t_4$, the $\phi R$ clock signal on conductor 608 returns to a high level such that the latch circuit formed by NAND gates 606 and 607 is no longer held in the reset state and will, accordingly, latch into the state defined by the logic level at the output of NAND gate 605 thereby producing the required digital output on conductor 611 which couples to the output of NAND gate 606. In a similar fashion the ROM encoder output applied to latch circuit 602 via conductor 612 is latched to produce a digital output on conductor 613; the ROM encoder output applied to latch circuit 603 via conductor 614 is latched to produce a digital output on conductor 615; and the ROM encoder output applied to latch circuit 604 via conductor 616 is latched to produce a digital output on conductor 617.

Figure 12:
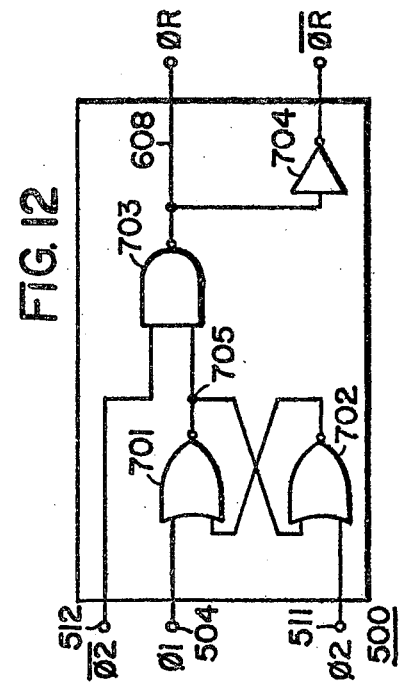
FIG. 12 is a logic diagram of the read-latch command generator of FIG. 1.

FIG. 12 shows output read-latch command generator circuit 700 which comprises cross-coupled NOR gates 701 and 702, NAND gate 703 and inverter 704. The inputs to circuit 700 are clock signals from the compare-latch command generator circuit 500 shown in FIG. 11. Compare mode clock $\phi 1$ couples via conductor 504 to an input of NOR gate 701, and compare mode clock $\phi 2$ couples to an input of NOR gate 702 via conductor 511. These signals alternately set and reset the latch formed by NOR gates 701 and 702 to produce a signal at the output of NOR gate 701 which is low during time intervals $t_1$ and $t_2$ and high during time intervals $t_3$ and $t_4$ (see FIG. 7). This output of NOR gate 701 couples to an input of NAND gate 703 via conductor 705. Latch mode clock $\overline{\phi 2}$ (FIG. 11) couples to a second input of NAND gate 703 via conductor 512. As shown in FIG. 7, latch mode clock $\overline{\phi 2}$ is low during time interval $t_3$ and high during time intervals $t_1$, $t_2$ and $t_4$. Thus the coincidence of high levels at the input of NAND gate 703 produces the output read-latch command $\phi R$ at the output of NAND gate 703 which couples to conductor 609. This signal is coupled to the input of inverter 704 whose output couples to conductor 609 which is the inverted output read-latch command $\overline{\phi R}$.

What is claimed is:

1. An analog-to-digital converter comprising:
   (a) means for receiving an analog signal;
   (b) first comparator means responsive to said analog signal and including
      (i) means for providing a first series of reference voltages ranging between a minimum voltage and a maximum voltage;
      (ii) a first plurality of differential comparison circuits, each having associated with it one of said first series of reference voltages, each of said differential comparison circuits comprising a current splitting network having first and second terminals for providing first and second increments of current when said analog signal exceeds said associated reference voltage; and means having a third terminal for providing a third increment of current when said analog signal is less than said associated reference voltage;
      (iii) a plurality of first output means each having an output terminal, each of said first output means being coupled to said first terminal of an associated differential comparison circuit and to said third terminal of an adjacent differential comparison circuit, and a pair of second output means each having an output terminal, one of said second output means being coupled to said first terminal of the differential comparison circuit associated with said minimum voltage, and one of said second output means being coupled to said third terminal of the differential comparison circuit associated with said maximum voltage, one of said output means generating a first output signal at its output terminal in the absence of any current increment input to such output means; and
      (iv) current summing means responsive to said second terminals for adding said second increments of current to form a reference current;
   (c) first encoder means responsive to said first output signal for producing a first digital number;
   (d) subtractor means responsive to said analog signal and said reference current for producing an intermediate output signal;
   (e) second comparator means responsive to said intermediate output signal and including
      (i) means for providing a second series of reference voltages; and
      (ii) comparison means responsive to said second series of reference voltages and said intermediate output signal for generating a second output signal; and
   (f) second encoder means responsive to said second output signal for producing a second digital number.

2. The analog-to-digital converter as recited in claim 1 wherein said first encoder means and said subtractor means produce their respective first digital number and intermediate output signal substantially concurrently.

3. The analog-to-digital converter as recited in claim 1 wherein said subtractor means comprises
   operational amplifier means having a non-inverting input coupled to said analog signal receiving means, an inverting input, and an output forming the output of said subtractor means;
   current mirror circuit means having a first terminal coupled to said reference current and a second terminal coupled to said inverting input of said operational amplifier means, said current mirror circuit means producing at said second terminal a mirror current equal in magnitude to said reference current; and
   impedance means coupled between said inverting input and said output of said operational amplifier means.

4. The analog-to-digital converter as recited in claim 1 wherein said first and second digital numbers are binary numbers.

5. The analog-to-digital converter as recited in claim 1 wherein said first and second digital numbers are other than binary numbers.

6. The analog-to-digital converter as recited in claim 1 wherein each of said differential comparison circuits in said first comparator further comprises:
a constant current source;
a first mode select transistor having its emitter coupled to said constant current source and its base coupled to a first clock signal;
a second mode select transistor having its emitter coupled to said constant current source and its base coupled to a second clock signal, said first and second clock signals being complementary;
first and second input transistor having their emitters coupled to the collector of said first mode select transistor and their bases coupled, respectively, to said analog signal and said associated reference voltage;
first and second cross-coupled latching transistors having their emitters coupled to the collector of said second mode select transistor and having their collectors coupled, respectively, to the collectors of said second and first input transistors; and wherein said current splitting network is coupled to the collector of said first input transistor and said means for providing a third increment of current is coupled to the collector of said second input transistor.

7. The analog-to-digital converter as recited in claim 1 wherein said means for providing a third increment of current in each of said differential comparison circuits comprises a second current splitting network having said third terminal for providing said third increment of current, and having a fourth terminal for providing a fourth increment of current when said analog signal is less than said associated reference voltage, and wherein said first comparator means further comprises additional current summing means responsive to said fourth terminals for adding said fourth increments of current to form an additional reference current.

8. The analog-to-digital converter as recited in claim 1 wherein said first output means comprise dual emitter transistors and wherein said second output means comprise single emitter transistors.

9. The analog-to-digital converter as recited in claim 1 wherein said comparison means of said second comparator comprises
a second plurality of differential comparison circuits, each having associated with it one of said second series of reference voltages and including means for generating a fifth increment of current when said intermediate output signal exceeds said associated reference voltage and means for generating a sixth increment of current when said intermediate output signal is less than said associated reference voltage, and
means responsive to said fifth and sixth increments of current for generating said second output signal.

10. The analog-to-digital converter as recited in claim 9 wherein said means responsive to said fifth and sixth increments of current comprises a plurality of dual emitter transistors each having a first emitter responsive to one of said fifth increments of current and a second emitter responsive to one of said sixth increments of current.

11. The analog-to-digital converter as recited in claim 6 wherein each of said differential comparison circuits further comprises first and second voltage level shifting circuits, said first voltage level shifting circuit being coupled between the collector of said first input transistor and the base of said first cross-coupled transistor, and said second voltage level shifting circuit being coupled between the collector of said second input transistor and the base of said second cross-coupled transistor, whereby the switching speed of said cross-coupled transistors is increased.

12. The analog-to-digital converter as recited in claim 11 further comprising a power supply, and wherein each of said voltage level shifting circuits comprise
a first transistor having a base coupled to the collector of said associated input transistor, a collector and an emitter;
a resistor having first and second terminals, said first terminal being coupled to the emitter of said first transistor;
a second transistor having a base coupled to the first terminal of said resistor, a collector coupled to the collector of said first transistor and to said power supply, and an emitter coupled to the second terminal of said resistor; and
a third transistor having a collector coupled to the second terminal of said resistor, a base coupled to the emitter of said second transistor, and an emitter coupled to the base of said associated cross-coupled transistor.

13. The analog-to-digital converter as recited in claim 1 wherein said first and second digital numbers represent the most significant bits and least significant bits, respectively, of the converted analog signal.

* * * * *